US008407412B2

(12) United States Patent
Rajan et al.

(10) Patent No.: US 8,407,412 B2
(45) Date of Patent: Mar. 26, 2013

(54) POWER MANAGEMENT OF MEMORY CIRCUITS BY VIRTUAL MEMORY SIMULATION

(75) Inventors: Suresh Natarajan Rajan, San Jose, CA (US); Michael John Smith, Palo Alto, CA (US); David T. Wang, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/343,612

(22) Filed: Jan. 4, 2012

(65) Prior Publication Data

US 2012/0124281 A1 May 17, 2012

Related U.S. Application Data

(63) Continuation of application No. 12/816,756, filed on Jun. 16, 2010, now Pat. No. 8,122,207, which is a continuation of application No. 11/538,041, filed on Oct. 2, 2006, now abandoned, which is a continuation-in-part of application No. 11/524,811, (Continued)

(51) Int. Cl.
*G06F 12/00* (2006.01)
(52) U.S. Cl. .. 711/105; 711/154; 711/167; 711/E12.001
(58) Field of Classification Search .................. None
See application file for complete search history.

(56) References Cited

U.S. PATENT DOCUMENTS

| | | | |
|---|---|---|---|
| 3,800,292 A | 3/1974 | Curley et al. | |
| 4,069,452 A | 1/1978 | Conway et al. | |
| 4,334,307 A | 6/1982 | Bourgeois et al. | |
| 4,345,319 A | 8/1982 | Bernardini et al. | |
| 4,566,082 A | 1/1986 | Anderson | |
| 4,794,597 A | 12/1988 | Ooba et al. | |
| 4,807,191 A | 2/1989 | Flannagan | |
| 4,862,347 A | 8/1989 | Rudy | |
| 4,912,678 A | 3/1990 | Mashiko | |
| 4,922,451 A | 5/1990 | Lo et al. | |
| 4,937,791 A | 6/1990 | Steele et al. | |
| 4,956,694 A | 9/1990 | Eide | |
| 5,025,364 A | 6/1991 | Zellmer | |
| 5,193,072 A | 3/1993 | Frenkil et al. | |
| 5,212,666 A | 5/1993 | Takeda | |

(Continued)

FOREIGN PATENT DOCUMENTS

| | | |
|---|---|---|
| EP | 0644547 | 3/1995 |
| JP | 05-298192 | 11/1993 |

(Continued)

OTHER PUBLICATIONS

Notice of Allowance from U.S. Appl. No. 11/762,010 Dated Jun. 8, 2011.

(Continued)

*Primary Examiner* — Denise Tran
(74) *Attorney, Agent, or Firm* — Fish & Richardson P.C.

(57) ABSTRACT

An apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

20 Claims, 10 Drawing Sheets

Related U.S. Application Data filed on Sep. 20, 2006, now Pat. No. 7,590,796, which is a continuation-in-part of application No. 11/461,439, filed on Jul. 31, 2006, now Pat. No. 7,580,312.

(56) References Cited

U.S. PATENT DOCUMENTS

| | | |
|---|---|---|
| 5,369,749 A | 11/1994 | Baker et al. |
| 5,390,334 A | 2/1995 | Harrison |
| 5,392,251 A | 2/1995 | Manning |
| 5,502,333 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,550,781 A | 8/1996 | Sugawara et al. |
| 5,608,262 A | 3/1997 | Degani et al. |
| 5,692,121 A | 11/1997 | Bozso et al. |
| RE35,733 E | 2/1998 | Hernandez et al. |
| 5,742,792 A | 4/1998 | Yanai et al. |
| 5,760,478 A | 6/1998 | Bozso et al. |
| 5,787,457 A | 7/1998 | Miller et al. |
| 5,819,065 A | 10/1998 | Chilton et al. |
| 5,831,833 A | 11/1998 | Shirakawa et al. |
| 5,838,165 A | 11/1998 | Chatter |
| 5,870,350 A | 2/1999 | Bertin |
| 5,872,907 A | 2/1999 | Griess et al. |
| 5,878,279 A | 3/1999 | Athenes |
| 5,913,072 A | 6/1999 | Wierenga |
| 5,915,167 A | 6/1999 | Leedy |
| 5,963,429 A | 10/1999 | Chen |
| 5,995,424 A | 11/1999 | Lawrence et al. |
| 6,001,671 A | 12/1999 | Fjelstad |
| 6,047,073 A | 4/2000 | Norris et al. |
| 6,058,451 A | 5/2000 | Bermingham et al. |
| 6,065,092 A | 5/2000 | Roy |
| 6,101,564 A | 8/2000 | Athenes et al. |
| 6,181,640 B1 | 1/2001 | Kang |
| 6,226,709 B1 | 5/2001 | Goodwin et al. |
| 6,226,730 B1 | 5/2001 | Murdoch et al. |
| 6,336,174 B1 | 1/2002 | Li et al. |
| 6,343,019 B1 | 1/2002 | Jiang et al. |
| 6,421,754 B1 | 7/2002 | Kau et al. |
| 6,424,532 B2 | 7/2002 | Kawamura |
| 6,445,591 B1 | 9/2002 | Kwong |
| 6,453,434 B2 | 9/2002 | Delp et al. |
| 6,455,348 B1 | 9/2002 | Yamaguchi |
| 6,476,476 B1 | 11/2002 | Glenn |
| 6,489,669 B2 | 12/2002 | Shimada et al. |
| 6,490,161 B1 | 12/2002 | Johnson |
| 6,492,726 B1 | 12/2002 | Quek et al. |
| 6,521,984 B2 | 2/2003 | Matsuura |
| 6,618,267 B1 | 9/2003 | Dalal et al. |
| 6,628,538 B2 | 9/2003 | Funaba et al. |
| 6,630,729 B2 | 10/2003 | Huang |
| 6,658,016 B1 | 12/2003 | Dai et al. |
| 6,659,512 B1 | 12/2003 | Harper et al. |
| 6,664,625 B2 | 12/2003 | Hiruma |
| 6,668,242 B1 | 12/2003 | Reynov et al. |
| 6,674,154 B2 | 1/2004 | Minamio et al. |
| 6,684,292 B2 | 1/2004 | Piccirillo et al. |
| 6,690,191 B2 | 2/2004 | Wu et al. |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,730,540 B2 | 5/2004 | Siniaguine |
| 6,731,009 B1 | 5/2004 | Jones et al. |
| 6,742,098 B1 | 5/2004 | Halbert et al. |
| 6,766,469 B2 | 7/2004 | Larson et al. |
| 6,845,027 B2 | 1/2005 | Mayer et al. |
| 6,854,043 B2 | 2/2005 | Hargis et al. |
| 6,878,570 B2 | 4/2005 | Lyu et al. |
| 6,914,786 B1 | 7/2005 | Paulsen et al. |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 7,007,095 B2 | 2/2006 | Chen et al. |
| 7,026,708 B2 | 4/2006 | Cady et al. |
| 7,028,215 B2 | 4/2006 | Depew et al. |
| 7,043,611 B2 | 5/2006 | McClannahan et al. |
| 7,045,396 B2 | 5/2006 | Crowley et al. |
| 7,053,470 B1 | 5/2006 | Sellers et al. |
| 7,053,478 B2 | 5/2006 | Roper et al. |
| 7,066,741 B2 | 6/2006 | Burns et al. |
| 7,079,396 B2 | 7/2006 | Gates et al. |
| 7,119,428 B2 | 10/2006 | Tanie et al. |
| 7,127,567 B2 | 10/2006 | Ramakrishnan et al. |
| 7,138,823 B2 | 11/2006 | Janzen et al. |
| 7,210,059 B2 | 4/2007 | Jeddoloh |
| 7,215,561 B2 | 5/2007 | Park et al. |
| 7,218,566 B1 | 5/2007 | Totolos, Jr. et al. |
| 7,231,562 B2 | 6/2007 | Ohlhoff et al. |
| 7,234,081 B2 | 6/2007 | Nguyen et al. |
| 7,243,185 B2 | 7/2007 | See et al. |
| 7,274,583 B2 | 9/2007 | Park et al. |
| 7,277,333 B2 | 10/2007 | Schaefer |
| 7,302,598 B2 | 11/2007 | Suzuki et al. |
| 7,317,250 B2 | 1/2008 | Koh et al. |
| 7,337,293 B2 | 2/2008 | Brittain et al. |
| 7,366,947 B2 | 4/2008 | Gower et al. |
| 7,414,917 B2 | 8/2008 | Ruckerbauer et al. |
| 7,428,644 B2 | 9/2008 | Jeddoloh et al. |
| 7,457,122 B2 | 11/2008 | Lai et al. |
| 7,474,576 B2 | 1/2009 | Co et al. |
| 7,480,147 B2 | 1/2009 | Hoss et al. |
| 7,480,774 B2 | 1/2009 | Ellis et al. |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,761,724 B2 | 7/2010 | Rajan et al. |
| 7,934,070 B2 | 4/2011 | Brittain et al. |
| 7,990,797 B2 | 8/2011 | Moshayedi et al. |
| 8,122,207 B2 * | 2/2012 | Rajan et al. ............... 711/154 |
| 2006/0179262 A | 8/2000 | Brittain et al. |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0046129 A1 | 11/2001 | Broglia et al. |
| 2001/0046163 A1 | 11/2001 | Yanagawa |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0060945 A1 | 5/2002 | Ikeda |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0129204 A1 | 9/2002 | Leighnor et al. |
| 2002/0167092 A1 | 11/2002 | Fee et al. |
| 2002/0172024 A1 | 11/2002 | Hui et al. |
| 2003/0011993 A1 | 1/2003 | Summers et al. |
| 2003/0016550 A1 | 1/2003 | Yoo et al. |
| 2003/0026155 A1 | 2/2003 | Yamagata |
| 2003/0026159 A1 | 2/2003 | Frankowsky et al. |
| 2003/0041295 A1 | 2/2003 | Hou et al. |
| 2003/0083855 A1 | 5/2003 | Fukuyama |
| 2003/0088743 A1 | 5/2003 | Rader |
| 2003/0123389 A1 | 7/2003 | Russell et al. |
| 2003/0127737 A1 | 7/2003 | Takahashi |
| 2003/0164539 A1 | 9/2003 | Yau |
| 2003/0164543 A1 | 9/2003 | Kheng Lee |
| 2003/0183934 A1 | 10/2003 | Barrett |
| 2003/0230801 A1 | 12/2003 | Jiang et al. |
| 2003/0234664 A1 | 12/2003 | Yamagata |

| | | |
|---|---|---|
| 2004/0016994 A1 | 1/2004 | Huang |
| 2004/0034755 A1 | 2/2004 | LaBerge et al. |
| 2004/0042503 A1 | 3/2004 | Shaeffer et al. |
| 2004/0083324 A1 | 4/2004 | Rabinovitz et al. |
| 2004/0100837 A1 | 5/2004 | Lee |
| 2004/0195682 A1 | 10/2004 | Kimura |
| 2004/0205433 A1 | 10/2004 | Gower et al. |
| 2004/0225858 A1 | 11/2004 | Brueggen |
| 2004/0228196 A1 | 11/2004 | Kwak et al. |
| 2004/0236877 A1 | 11/2004 | Burton |
| 2004/0250989 A1 | 12/2004 | Im et al. |
| 2005/0034004 A1 | 2/2005 | Bunker et al. |
| 2005/0086548 A1 | 4/2005 | Haid et al. |
| 2005/0108460 A1 | 5/2005 | David |
| 2005/0127531 A1 | 6/2005 | Tay et al. |
| 2005/0135176 A1 | 6/2005 | Ramakrishnan et al. |
| 2005/0138304 A1 | 6/2005 | Ramakrishnan et al. |
| 2005/0139977 A1 | 6/2005 | Nishio et al. |
| 2005/0193183 A1 | 9/2005 | Barth et al. |
| 2005/0194676 A1 | 9/2005 | Fukuda et al. |
| 2005/0201063 A1 | 9/2005 | Lee et al. |
| 2005/0232049 A1 | 10/2005 | Park |
| 2005/0243635 A1 | 11/2005 | Schaefer |
| 2005/0246558 A1 | 11/2005 | Ku |
| 2005/0263312 A1 | 12/2005 | Bolken et al. |
| 2005/0281096 A1 | 12/2005 | Bhakta et al. |
| 2005/0286334 A1 | 12/2005 | Saito et al. |
| 2006/0038597 A1 | 2/2006 | Becker et al. |
| 2006/0039204 A1 | 2/2006 | Cornelius |
| 2006/0041730 A1 | 2/2006 | Larson |
| 2006/0049502 A1 | 3/2006 | Goodwin et al. |
| 2006/0062047 A1 | 3/2006 | Bhakta et al. |
| 2006/0087900 A1 | 4/2006 | Bucksch et al. |
| 2006/0112219 A1 | 5/2006 | Chawla et al. |
| 2006/0118933 A1 | 6/2006 | Haba |
| 2006/0136791 A1 | 6/2006 | Nierle |
| 2006/0180926 A1 | 8/2006 | Mullen et al. |
| 2006/0195631 A1 | 8/2006 | Rajamani |
| 2006/0236165 A1 | 10/2006 | Cepulis et al. |
| 2006/0236201 A1 | 10/2006 | Gower et al. |
| 2007/0005998 A1 | 1/2007 | Jain et al. |
| 2007/0088995 A1 | 4/2007 | Tsern et al. |
| 2007/0091696 A1 | 4/2007 | Niggemeier et al. |
| 2007/0136537 A1 | 6/2007 | Doblar et al. |
| 2007/0188997 A1 | 8/2007 | Hockanson et al. |
| 2007/0204075 A1 | 8/2007 | Rajan et al. |
| 2007/0279084 A1 | 12/2007 | Oh et al. |
| 2008/0002447 A1 | 1/2008 | Gulachenski et al. |
| 2008/0010435 A1 | 1/2008 | Smith et al. |
| 2008/0028135 A1 | 1/2008 | Rajan et al. |
| 2008/0028137 A1 | 1/2008 | Schakel et al. |
| 2008/0086588 A1 | 4/2008 | Danilak et al. |
| 2008/0089034 A1 | 4/2008 | Hoss et al. |
| 2008/0098277 A1 | 4/2008 | Hazelzet |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0120443 A1 | 5/2008 | Rajan et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126692 A1 | 5/2008 | Rajan et al. |
| 2008/0133825 A1 | 6/2008 | Rajan et al. |
| 2008/0155136 A1 | 6/2008 | Hishino |
| 2008/0159027 A1 | 7/2008 | Kim |
| 2008/0170425 A1 | 7/2008 | Rajan |
| 2008/0195894 A1 | 8/2008 | Schreck et al. |
| 2009/0024789 A1 | 1/2009 | Rajan et al. |
| 2009/0024790 A1 | 1/2009 | Rajan et al. |
| 2009/0109613 A1 | 4/2009 | Legen et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan |
| 2010/0281280 A1 | 11/2010 | Rajan et al. |

FOREIGN PATENT DOCUMENTS

| | | |
|---|---|---|
| JP | 3304893 B2 | 5/2002 |
| JP | 04-327474 | 11/2004 |
| WO | WO00/45270 | 8/2000 |
| WO | WO01/90900 | 11/2001 |
| WO | WO01/97160 | 12/2001 |
| WO | WO2004/044754 | 5/2004 |
| WO | WO2004/051645 | 6/2004 |
| WO | WO2007/028109 | 3/2007 |
| WO | WO2007/095080 | 8/2007 |

OTHER PUBLICATIONS

Non-Final Office Action from U.S. Appl. No. 11/672,924 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 11/939,432 Dated Feb. 18, 2011.

Notice of Allowance from U.S. Appl. No. 12/144,396 Dated Feb. 1, 2011.
Notice of Allowance from U.S. Appl. No. 11/762,013 Dated Feb. 23, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action from German Patent Application No. 11 2006 001 810.8-55 Dated Feb. 18, 2009 (With Translation).
Great Britain Office Action from GB Patent Application No. GB0800734.6 Dated Mar. 1, 2010.
Non-Final Office Action from U.S. Appl. No. 11/461,420 Dated Jul. 23, 2009.
Final Office Action from U.S. Appl. No. 11/461,420 Dated Apr. 28, 2010.
Notice of Allowance from U.S. Appl. No. 11/461,430 Dated Sep. 10, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Notice of Allowance from U.S. Appl. No. 11/553,372 Dated Mar. 12, 2010.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/553,399 Dated Mar. 22, 2010.
Non-Final Office Action from U.S. Appl. No. 11/588,739 Dated Dec. 29, 2009.
Notice of Allowance from U.S. Appl. No. 11/611,374 Dated Sep. 15, 2009.
Notice of Allowance from U.S. Appl. No. 11/611,374 Dated Apr. 5, 2010.
Non-Final Office Action from U.S. Appl. No. 11/702,960 Dated Sep. 25, 2009.
Non-Final Office Action from U.S. Appl. No. 11/702,981 Dated Mar. 11, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/828,181 Dated Mar. 2, 2010.
Non-Final Office Action from U.S. Appl. No. 11/828,182 Dated Mar. 29, 2010.
Non-Final Office Action from U.S. Appl. No. 11/858,518 Dated Aug. 14, 2009.
Final Office Action from U.S. Appl. No. 11/858,518 Dated Apr. 21, 2010.
Non-Final Office Action from U.S. Appl. No. 11/929,432 Dated Jan. 14, 2010.
Non-Final Office Action from U.S. Appl. No. 11/929,500 Dated Oct. 13, 2009.
Non-Final Office Action from U.S. Appl. No. 11/929,571 Dated Mar. 3, 2010.
Non-Final Office Action from U.S. Appl. No. 11/929,631 Dated Mar. 3, 2010.
Non-Final Office Action from U.S. Appl. No. 11/929,636 Dated Mar. 9, 2010.
Non-Final Office Action from U.S. Appl. No. 11/929,655 Dated Mar. 3, 2010.
Notice of Allowance from U.S. Appl. No. 11/939,432 Dated Sep. 24, 2009.
Non-Final Office Action from U.S. Appl. No. 11/939,432 Dated Apr. 12, 2010.
Non-Final Office Action from U.S. Appl. No. 11/941,589 Dated Oct. 1, 2009.
Notice of Allowance from U.S. Appl. No. 12/111,819 Dated Mar. 10, 2010.
Non-Final Office Action from U.S. Appl. No. 12/507,682 Dated Mar. 8, 2010.
Supplemental European Search Report and Search Opinion issued Sep. 21, 2009 in European Application No. 07870726.2, 8 pp.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Dec. 3, 2010.

Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Notice of Allowance from U.S. Appl. No. 11/762,010 Dated Jul. 2, 2010.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Jun. 29, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,500 Dated Jun. 24, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 28, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/276,212 Dated Mar. 15, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.

Final Office Action from U.S. Appl. No. 11/855,805, Dated Jun. 14, 2012.
Office Action, including English translatiion, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.

* cited by examiner

POWER MANAGEMENT OF MEMORY CIRCUITS BY VIRTUAL MEMORY SIMULATION

RELATED APPLICATION(S)

The present application is a continuation of an application entitled "APPARATUS AND METHOD FOR POWER MANAGEMENT OF MEMORY CIRCUITS BY A SYSTEM OR COMPONENT THEREOF" and filed Jun. 16, 2010 under application Ser. No. 12/816,756, and issued as U.S. Pat. No. 8,122,207 on Feb. 21, 2012, which is in turn a continuation of an application entitled "APPARATUS AND METHOD FOR POWER MANAGEMENT OF MEMORY CIRCUITS BY A SYSTEM OR COMPONENT THEREOF" and filed Oct. 2, 2006 under application Ser. No. 11/538,041 now abandoned which, in turn is a continuation-in-part of an application entitled "SYSTEM AND METHOD FOR POWER MANAGEMENT IN MEMORY SYSTEMS" and filed Sep. 20, 2006 under application Ser. No. 11/524,811, and issued as U.S. Pat. No. 7,590,796 on Sep. 15, 2009 which, in turn, is a continuation-in-part of an application entitled "POWER SAVING SYSTEM AND METHOD FOR USE WITH A PLURALITY OF MEMORY CIRCUITS" and filed Jul. 31, 2006 under application Ser. No. 11/461,439, and issued as U.S. Pat. No. 7,580,312 on Aug. 25, 2009 which are each incorporated herein by reference for all purposes. However, insofar as any definitions, information used for claim interpretation, etc. from the above parent applications conflict with that set forth herein, such definitions, information, etc. in the present application should apply.

FIELD OF THE INVENTION

The present invention relates to memory, and more particularly to power management in memory systems that contain multiple memory circuits.

BACKGROUND

The memory capacity requirements of various systems are increasing rapidly. However, other industry trends such as higher memory bus speeds and small form factor machines, etc. are reducing the number of memory module slots in such systems. Thus, a need exists in the industry for larger capacity memory circuits to be used in such systems.

However, there is also a limit to the power that may be dissipated per unit volume in the space available to the memory circuits. As a result, large capacity memory modules may be limited in terms of power that the memory modules may dissipate, and/or limited in terms of the ability of power supply systems to deliver sufficient power to such memory modules. There is thus a need for overcoming these limitations and/or other problems associated with the prior art.

SUMMARY

An apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

DETAILED DESCRIPTION

Figure 1:
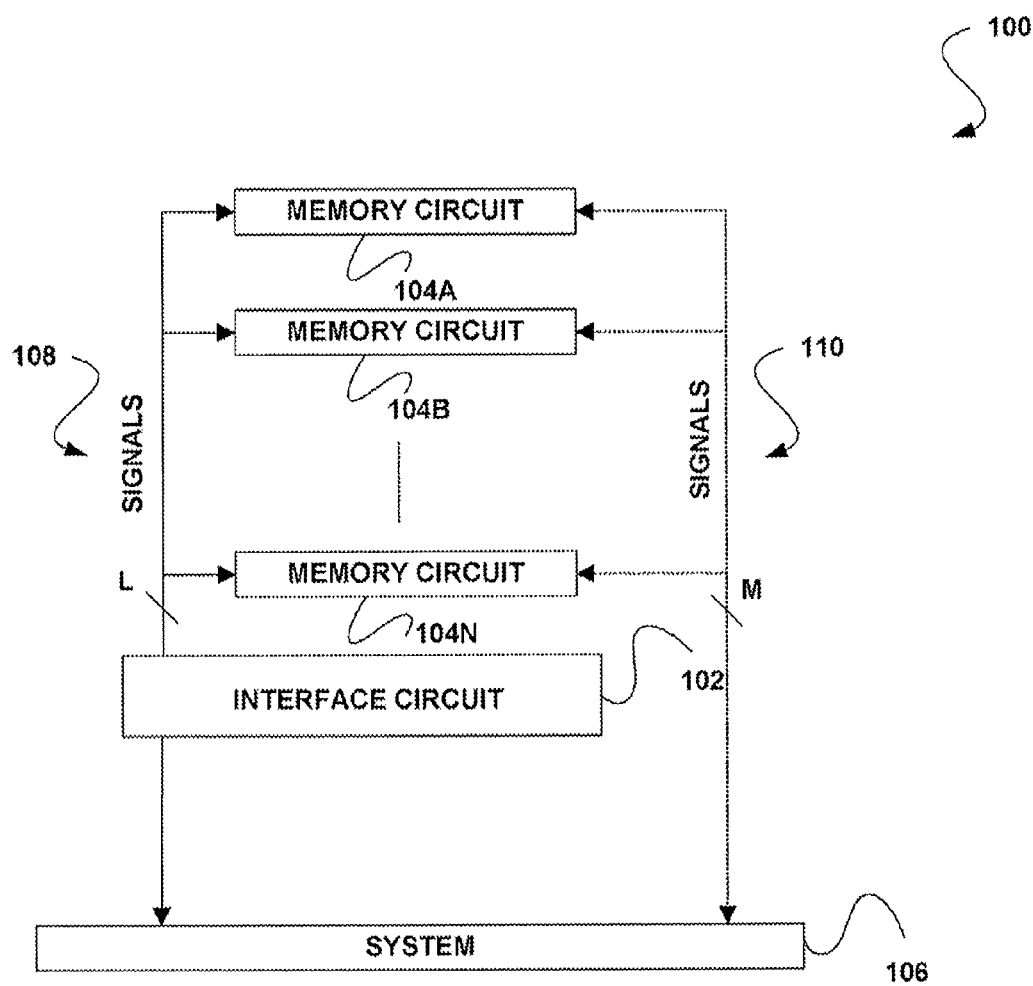
FIG. 1 illustrates a multiple memory circuit framework, in accordance with one embodiment.

FIG. 1 illustrates a multiple memory circuit framework 100, in accordance with one embodiment. As shown, included are an interface circuit 102, a plurality of memory circuits 104A, 104B, 104N, and a system 106. In the context of the present description, such memory circuits 104A, 104B, 104N may include any circuit capable of serving as memory.

For example, in various embodiments, at least one of the memory circuits 104A, 104B, 104N may include a monolithic memory circuit, a semiconductor die, a chip, a packaged memory circuit, or any other type of tangible memory circuit. In one embodiment, the memory circuits 104A, 104B, 104N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (SDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (S GRAM), and/or any other type of DRAM.

In another embodiment, at least one of the memory circuits 104A, 104B, 104N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), Low-Power Synchronous Dynamic Random Access Memory (LP-SDRAM), Polymer Ferroelectric RAM (PFRAM), OVONICS Unified Memory (OUM) or other chalcogenide memory, Phase-change Memory (PCM), Phase-change Random Access Memory (PRAM), Ferroelectric RAM (FeRAM), REsistance RAM (R-RAM or RRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly, as an option, the memory circuits 104A, 104B, 104N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 104A, 104B, 104N may or may not be positioned on any type of material forming a substrate, card, module, sheet, fabric, board, carrier or other any other type of solid or flexible entity, form, or object. Of course, in other embodiments, the memory circuits 104A, 104B, 104N may or may not be positioned in or on any desired entity, form, or object for packaging purposes. Still yet, the memory circuits 104A, 104B, 104N may or may not be organized, either as a group (or as groups) collectively, or individually, onto one or more portions(s). In the context of the present description, the term portion(s) (e.g. of a memory circuit(s)) shall refer to any physical, logical or electrical arrangement(s), partition(s), subdivisions(s) (e.g. banks, sub-banks, ranks, sub-ranks, rows, columns, pages, etc.), or any other portion(s), for that matter.

Further, in the context of the present description, the system 106 may include any system capable of requesting and/or initiating a process that results in an access of the memory circuits 104A, 104B, 104N. As an option, the system 106 may accomplish this utilizing a memory controller (not shown), or any other desired mechanism. In one embodiment, such system 106 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 102 may, in the context of the present description, refer to any circuit capable of communicating (e.g. interfacing, buffering, etc.) with the memory circuits 104A, 104B, 104N and the system 106. For example, the interface circuit 102 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 104A, 104B, 104N and the system 106. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 102 may include one or more circuits, such as a buffer (e.g. buffer chip, multiplexer/de-multiplexer chip, synchronous multiplexer/de-multiplexer chip, etc.), register (e.g. register chip, data register chip, address/control register chip, etc.), advanced memory buffer (AMB) (e.g. AMB chip, etc.), a component positioned on at least one DIMM, etc.

In various embodiments and in the context of the present description, a buffer chip may be used to interface bidirectional data signals, and may or may not use a clock to re-time or re-synchronize signals in a well known manner. A bidirectional signal is a well known use of a single connection to transmit data in two directions. A data register chip may be a register chip that also interfaces bidirectional data signals. A multiplexer/de-multiplexer chip is a well known circuit that may interface a first number of bidirectional signals to a second number of bidirectional signals. A synchronous multiplexer/de-multiplexer chip may additionally use a clock to re-time or re-synchronize the first or second number of signals. In the context of the present description, a register chip may be used to interface and optionally re-time or re-synchronize address and control signals. The term address/control register chip may be used to distinguish a register chip that only interfaces address and control signals from a data register chip, which may also interface data signals.

Moreover, the register may, in various embodiments, include a JEDEC Solid State Technology Association (known as JEDEC) standard register (a JEDEC register), a register with forwarding, storing, and/or buffering capabilities, etc. In various embodiments, the registers, buffers, and/or any other interface circuit(s) 102 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 102 may optionally be manufactured in monolithic form, packaged form, printed form, and/or any other manufactured form of circuit, for that matter.

In still yet another embodiment, a plurality of the aforementioned interface circuits 102 may serve, in combination, to interface the memory circuits 104A, 104B, 104N and the system 106. Thus, in various embodiments, one, two, three, four, or more interface circuits 102 may be utilized for such interfacing purposes. In addition, multiple interface circuits 102 may be relatively configured or connected in any desired manner. For example, the interface circuits 102 may be configured or connected in parallel, serially, or in various combinations thereof The multiple interface circuits 102 may use direct connections to each other, indirect connections to each other, or even a combination thereof Furthermore, any number of the interface circuits 102 may be allocated to any number of the memory circuits 104A, 104B, 104N. In various other embodiments, each of the plurality of interface circuits 102 may be the same or different. Even still, the interface circuits 102 may share the same or similar interface tasks and/or perform different interface tasks.

While the memory circuits 104A, 104B, 104N, interface circuit 102, and system 106 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 102 (or portion(s) thereof) may be packaged with at least one of the memory circuits 104A, 104B, 104N. Thus, a DRAM stack may or may not include at least one interface circuit (or portion(s) thereof). In other embodiments, different numbers of the interface circuit 102 (or portions(s) thereof) may be packaged together. Such different packaging arrangements, when employed, may optionally improve the utilization of a monolithic silicon implementation, for example.

The interface circuit 102 may be capable of various functionality, in the context of different embodiments. For example, in one optional embodiment, the interface circuit 102 may interface a plurality of signals 108 that are connected between the memory circuits 104A, 104B, 104N and the system 106. The signals 108 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 108 may represent all of the signals that are connected between the memory circuits 104A, 104B, 104N and the system 106. In other aspects, at least a portion of signals 110 may use direct connections between the memory circuits 104A, 104B, 104N and the system 106. The signals 110 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections. Moreover, the number of interfaced signals 108 (e.g. vs. a number of the signals that use direct connections 110, etc.) may vary such that the interfaced signals 108 may include at least a majority of the total number of signal connections between the memory circuits 104A, 104B, 104N and the systems 106 (e.g. L>M, with L and M as shown in FIG. 1). In other embodiments, L may be less than or equal to M. In still other embodiments L and/or M may be zero.

In yet another embodiment, the interface circuit 102 and/or any component of the system 106 may or may not be operable to communicate with the memory circuits 104A, 104B, 104N for simulating at least one memory circuit. The memory circuits 104A, 104B, 104N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit shall hereafter be referred to, where appropriate for clarification purposes, as the at least one "virtual" memory circuit. In a similar fashion any property or aspect of such a physical memory circuit shall be referred to, where appropriate for clarification purposes, as a physical aspect (e.g. physical bank, physical portion, physical timing parameter, etc.). Further, any property or aspect of such a virtual memory circuit shall be referred to, where appropriate for clarification purposes, as a virtual aspect (e.g. virtual bank, virtual portion, virtual timing parameter, etc.).

In the context of the present description, the term simulate or simulation may refer to any simulating, emulating, transforming, disguising modifying, changing, altering, shaping, converting, etc., of at least one aspect of the memory circuits. In different embodiments, such aspect may include, for example, a number, a signal, a capacity, a portion (e.g. bank, partition, etc.), an organization (e.g. bank organization, etc.), a mapping (e.g. address mapping, etc.), a timing, a latency, a design parameter, a logical interface, a control system, a property, a behavior, and/or any other aspect, for that matter. Still yet, in various embodiments, any of the previous aspects or any other aspect, for that matter, may be power-related, meaning that such power-related aspect, at least in part, directly or indirectly affects power.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

In still additional exemplary embodiments, the aforementioned virtual aspect may be simulated (e.g. simulate a virtual aspect, the simulation of a virtual aspect, a simulated virtual aspect etc.). Further, in the context of the present description, the terms map, mapping, mapped, etc. refer to the link or connection from the physical aspects to the virtual aspects (e.g. map a physical aspect to a virtual aspect, mapping a physical aspect to a virtual aspect, a physical aspect mapped to a virtual aspect etc.). It should be noted that any use of such mapping or anything equivalent thereto is deemed to fall within the scope of the previously defined simulate or simulation term.

More illustrative information will now be set forth regarding optional functionality/architecture of different embodiments which may or may not be implemented in the context of FIG. 1, per the desires of the user. It should be strongly noted that the following information is set forth for illustrative purposes and should not be construed as limiting in any manner. For example, any of the following features may be optionally incorporated with or without the other features described.

Figure 2:
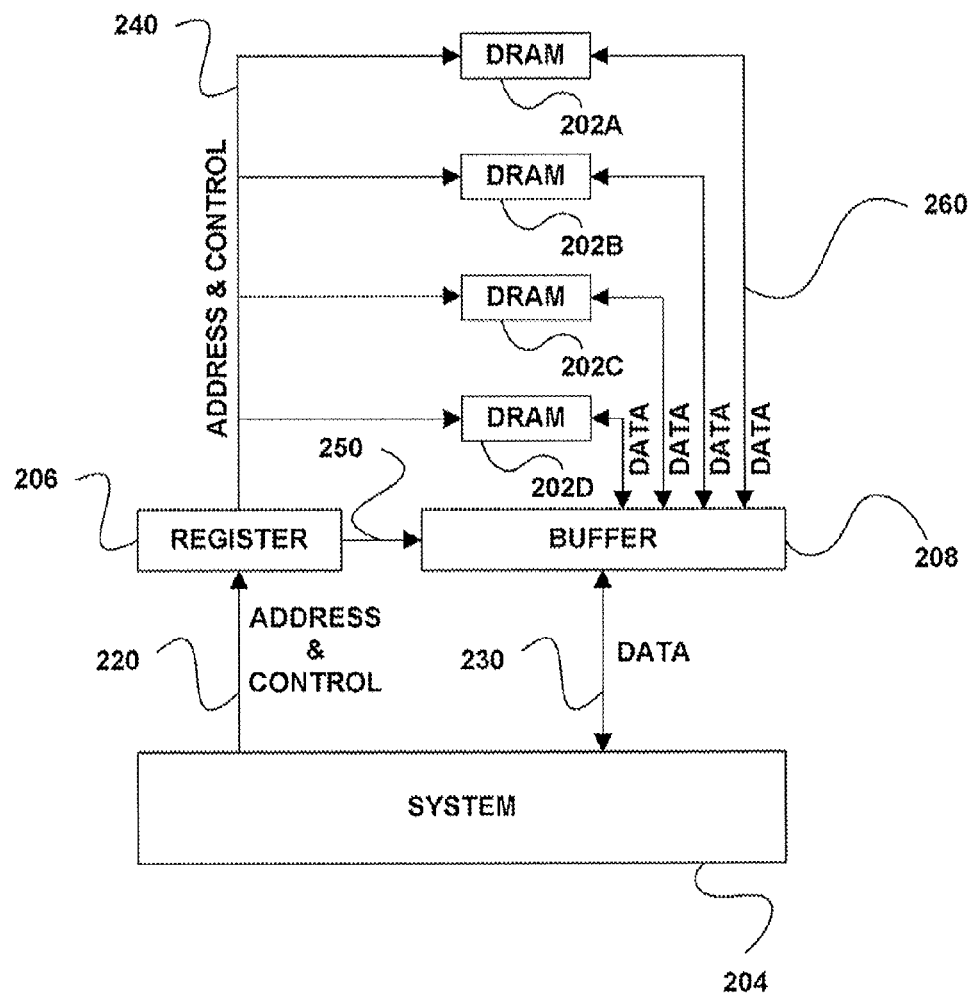
FIG. 2 shows an exemplary embodiment of an interface circuit including a register and a buffer that is operable to interface memory circuits and a system.

FIG. 2 shows an exemplary embodiment of an interface circuit that is operable to interface memory circuits 202A-D and a system 204. In this embodiment, the interface circuit includes a register 206 and a buffer 208. Address and control signals 220 from the system 204 are connected to the register 206, while data signals 230 from the system 204 are connected to the buffer 208. The register 206 drives address and control signals 240 to the memory circuits 202A-D and optionally drives address and control signals 250 to the buffer 208. Data signals 260 of the memory circuits 202A-D are connected to the buffer 208.

Figure 3:
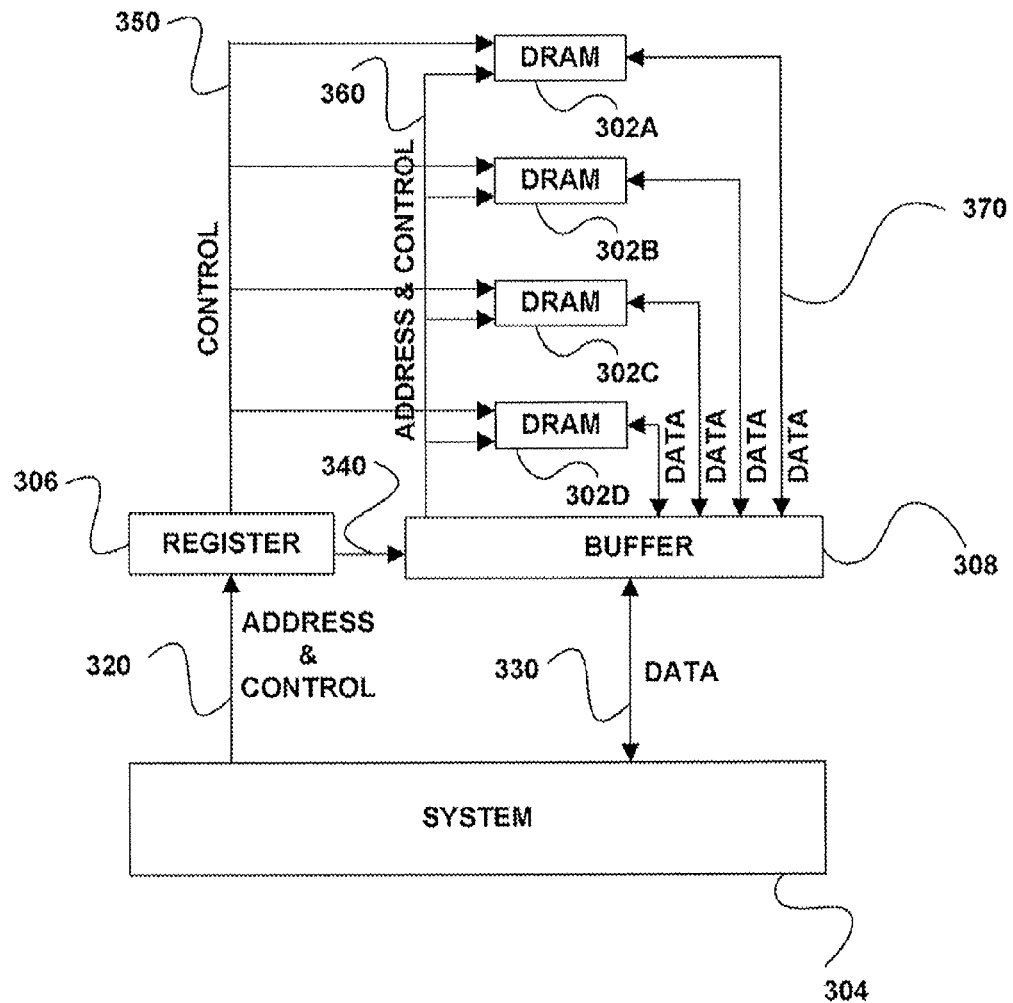
FIG. 3 shows an alternative exemplary embodiment of an interface circuit including a register and a buffer that is operable to interface memory circuits and a system.

FIG. 3 shows an exemplary embodiment of an interface circuit that is operable to interface memory circuits 302A-D and a system 304. In this embodiment, the interface circuit includes a register 306 and a buffer 308. Address and control signals 320 from the system 304 are connected to the register 306, while data signals 330 from the system 304 are connected to the buffer 308. The register 306 drives address and control signals 340 to the buffer 308, and optionally drives control signals 350 to the memory circuits 302A-D. The buffer 308 drives address and control signals 360. Data signals 370 of the memory circuits 304A-D are connected to the buffer 308.

Figure 4:
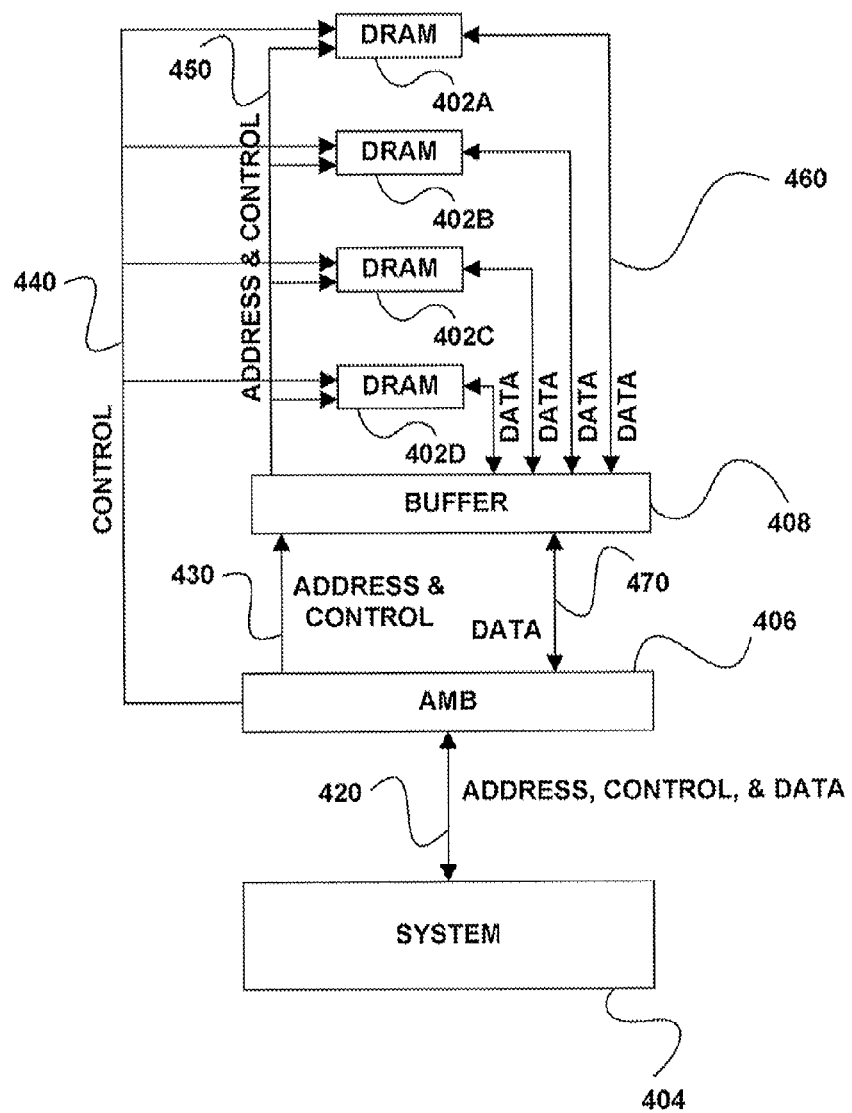
FIG. 4 shows an exemplary embodiment of an interface circuit including an advanced memory buffer (AMB) and a buffer that is operable to interface memory circuits and a system.

FIG. 4 shows an exemplary embodiment of an interface circuit that is operable to interface memory circuits 402A-D and a system 404. In this embodiment, the interface circuit includes an advanced memory buffer (AMB) 406 and a buffer 408. Address, control, and data signals 420 from the system 404 are connected to the AMB 406. The AMB 406 drives address and control signals 430 to the buffer 408 and optionally drives control signals 440 to the memory circuits 402A-D. The buffer 408 drives address and control signals 450. Data signals 460 of the memory circuits 402A-D are connected to the buffer 408. Data signals 470 of the buffer 408 are connected to the AMB 406.

Figure 5:
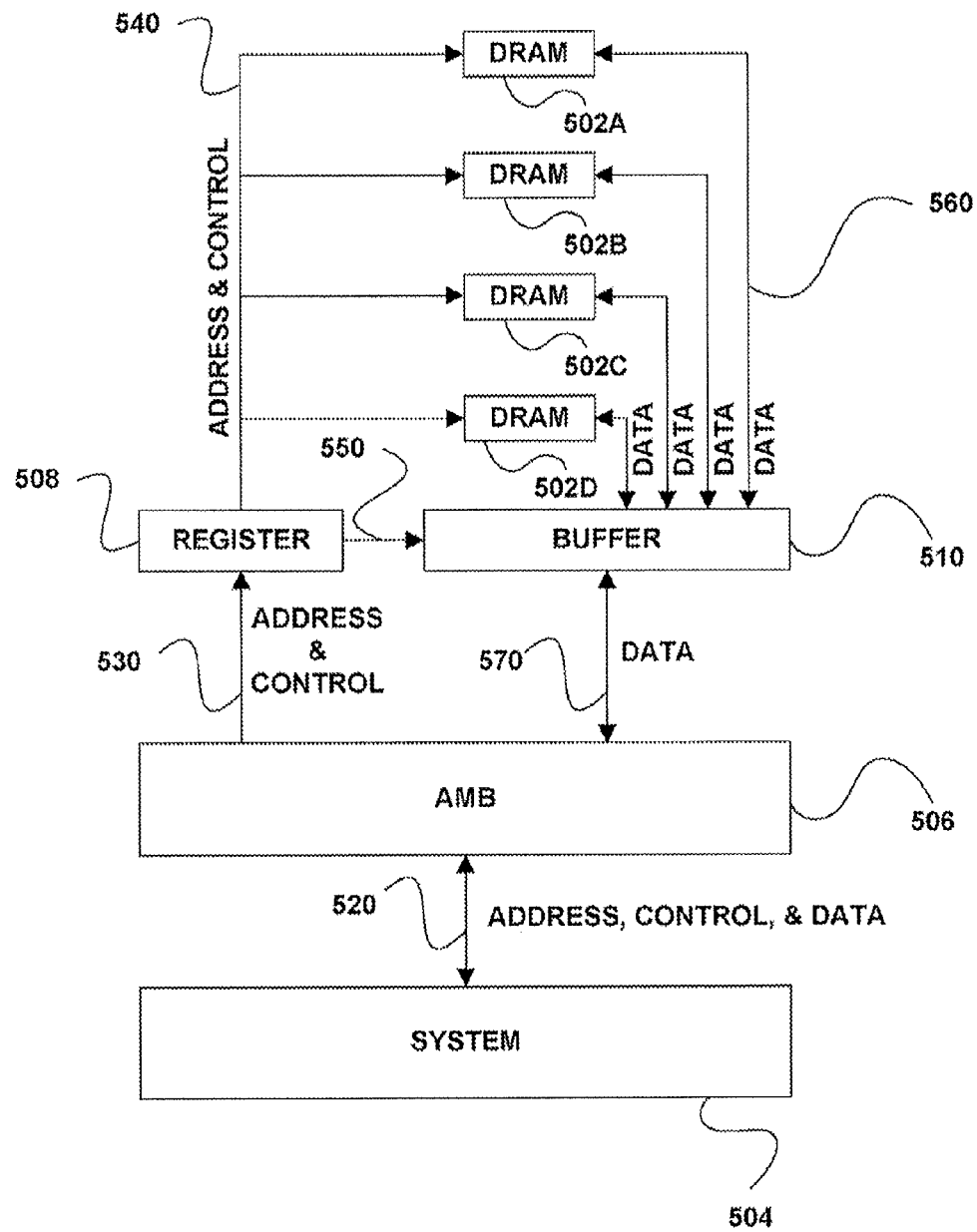
FIG. 5 shows an exemplary embodiment of an interface circuit including an AMB, a register, and a buffer that is operable to interface memory circuits and a system.

FIG. 5 shows an exemplary embodiment of an interface circuit that is operable to interface memory circuits 502A-D and a system 504. In this embodiment, the interface circuit includes an AMB 506, a register 508, and a buffer 510. Address, control, and data signals 520 from the system 504 are connected to the AMB 506. The AMB 506 drives address and control signals 530 to the register 508. The register, in turn, drives address and control signals 540 to the memory circuits 502A-D. It also optionally drives control signals 550 to the buffer 510. Data signals 560 from the memory circuits 502A-D are connected to the buffer 510. Data signals 570 of the buffer 510 are connected to the AMB 506.

Figure 6:
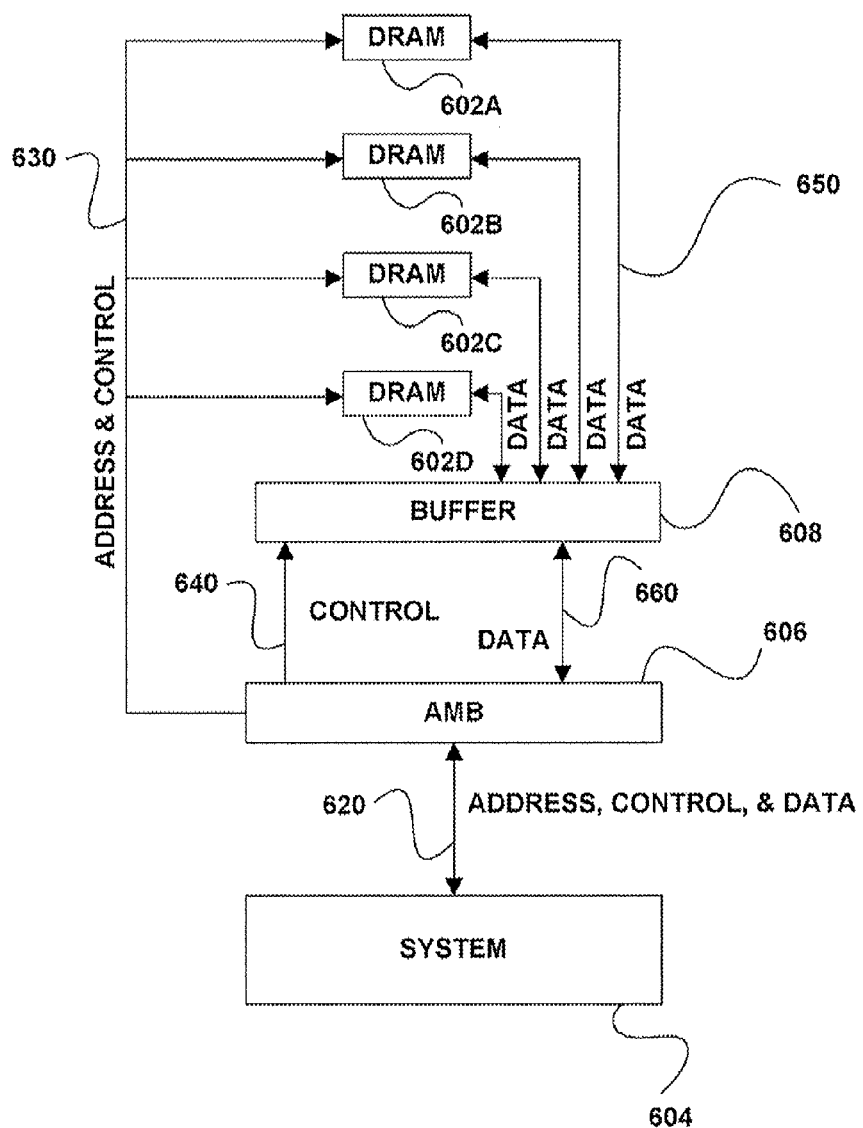
FIG. 6 shows an alternative exemplary embodiment of an interface circuit including an AMB and a buffer that is operable to interface memory circuits and a system.

FIG. 6 shows an exemplary embodiment of an interface circuit that is operable to interface memory circuits 602A-D and a system 604. In this embodiment, the interface circuit includes an AMB 606 and a buffer 608. Address, control, and data signals 620 from the system 604 are connected to the AMB 606. The AMB 606 drives address and control signals 630 to the memory circuits 602A-D as well as control signals 640 to the buffer 608. Data signals 650 from the memory circuits 602A-D are connected to the buffer 608. Data signals 660 are connected between the buffer 608 and the AMB 606.

In other embodiments, combinations of the above implementations shown in FIGS. 2-6 may be utilized. Just by way of example, one or more registers (register chip, address/control register chip, data register chip, JEDEC register, etc.) may be utilized in conjunction with one or more buffers (e.g. buffer chip, multiplexer/de-multiplexer chip, synchronous multiplexer/de-multiplexer chip and/or other intelligent interface circuits) with one or more AMBs (e.g. AMB chip, etc.). In other embodiments, these register(s), buffer(s), AMB(s) may be utilized alone and/or integrated in groups and/or integrated with or without the memory circuits.

The electrical connections between the buffer(s), the register(s), the AMB(s) and the memory circuits may be configured in any desired manner. In one optional embodiment, address, control (e.g. command, etc.), and clock signals may be common to all memory circuits (e.g. using one common bus). As another option, there may be multiple address, control and clock busses. As yet another option, there may be individual address, control and clock busses to each memory circuit. Similarly, data signals may be wired as one common bus, several busses or as an individual bus to each memory circuit. Of course, it should be noted that any combinations of such configurations may also be utilized. For example, the memory circuits may have one common address, control and clock bus with individual data busses. In another example, memory circuits may have one, two (or more) address, control and clock busses along with one, two (or more) data busses. In still yet another example, the memory circuits may have one address, control and clock bus together with two data busses (e.g. the number of address, control, clock and data busses may be different, etc.). In addition, the memory circuits may have one common address, control and clock bus and one common data bus. It should be noted that any other permutations and combinations of such address, control, clock and data buses may be utilized.

These configurations may therefore allow for the host system to only be in contact with a load of the buffer(s), or register(s), or AMB(s) on the memory bus. In this way, any electrical loading problems (e.g. bad signal integrity, improper signal timing, etc.) associated with the memory circuits may (but not necessarily) be prevented, in the context of various optional embodiments.

Furthermore, there may be any number of memory circuits. Just by way of example, the interface circuit(s) may be connected to 1, 2, 4, 8 or more memory circuits. In alternate embodiments, to permit data integrity storage or for other reasons, the interface circuit(s) may be connected to an odd number of memory circuits. Additionally, the memory circuits may be arranged in a single stack. Of course, however, the memory circuits may also be arranged in a plurality of stacks or in any other fashion.

In various embodiments where DRAM circuits are employed, such DRAM (e.g. DDR2 SDRAM) circuits may be composed of a plurality of portions (e.g. ranks, sub-ranks, banks, sub-banks, etc.) that may be capable of performing operations (e.g. precharge, active, read, write, refresh, etc.) in parallel (e.g. simultaneously, concurrently, overlapping, etc.). The JEDEC standards and specifications describe how DRAM (e.g. DDR2 SDRAM) circuits are composed and perform operations in response to commands. Purely as an example, a 512 Mb DDR2 SDRAM circuit that meets JEDEC specifications may be composed of four portions (e.g. banks, etc.) (each of which has 128 Mb of capacity) that are capable of performing operations in parallel in response to commands. As another example, a 2 Gb DDR2 SDRAM circuit that is compliant with JEDEC specifications may be composed of eight banks (each of which has 256 Mb of capacity). A portion (e.g. bank, etc.) of the DRAM circuit is said to be in the active state after an activate command is issued to that portion. A portion (e.g. bank, etc.) of the DRAM circuit is said to be in the precharge state after a precharge command is issued to that portion. When at least one portion (e.g. bank, etc.) of the DRAM circuit is in the active state, the entire DRAM circuit is said to be in the active state. When all portions (e.g. banks, etc.) of the DRAM circuit are in precharge state, the entire DRAM circuit is said to be in the precharge state. A relative time period spent by the entire DRAM circuit in precharge state with respect to the time period spent by the entire DRAM circuit in active state during normal operation may be defined as the precharge-to-active ratio.

DRAM circuits may also support a plurality of power management modes. Some of these modes may represent power saving modes. As an example, DDR2 SDRAMs may support four power saving modes. In particular, two active power down modes, precharge power down mode, and self-refresh mode may be supported, in one embodiment. A DRAM circuit may enter an active power down mode if the DRAM circuit is in the active state when it receives a power down command. A DRAM circuit may enter the precharge power down mode if the DRAM circuit is in the precharge state when it receives a power down command. A higher precharge-to-active ratio may increase the likelihood that a DRAM circuit may enter the precharge power down mode rather than an active power down mode when the DRAM circuit is the target of a power saving operation. In some types of DRAM circuits, the precharge power down mode and the self refresh mode may provide greater power savings that the active power down modes.

In one embodiment, the system may be operable to perform a power management operation on at least one of the memory circuits, and optionally on the interface circuit, based on the state of the at least one memory circuit. Such a power management operation may include, among others, a power saving operation. In the context of the present description, the term power saving operation may refer to any operation that results in at least some power savings.

In one such embodiment, the power saving operation may include applying a power saving command to one or more memory circuits, and optionally to the interface circuit, based on at least one state of one or more memory circuits. Such power saving command may include, for example, initiating a power down operation applied to one or more memory circuits, and optionally to the interface circuit. Further, such state may depend on identification of the current, past or predictable future status of one or more memory circuits, a predetermined combination of commands to the one or more memory circuits, a predetermined pattern of commands to the one or more memory circuits, a predetermined absence of commands to the one or more memory circuits, any command(s) to the one or more memory circuits, and/or any command(s) to one or more memory circuits other than the one or more memory circuits. Such commands may have occurred in the past, might be occurring in the present, or may be predicted to occur in the future. Future commands may be predicted since the system (e.g. memory controller, etc.) may be aware of future accesses to the memory circuits in advance of the execution of the commands by the memory circuits. In the context of the present description, such current, past, or predictable future status may refer to any property of the memory circuit that may be monitored, stored, and/or predicted.

For example, the system may identify at least one of a plurality of memory circuits that may not be accessed for some period of time. Such status identification may involve determining whether a portion(s) (e.g. bank(s), etc.) is being accessed in at least one of the plurality of memory circuits. Of course, any other technique may be used that results in the identification of at least one of the memory circuits (or portion(s) thereof) that is not being accessed (e.g. in a non-accessed state, etc.). In other embodiments, other such states may be detected or identified and used for power management.

In response to the identification of a memory circuit that is in a non-accessed state, a power saving operation may be initiated in association with the memory circuit (or portion(s) thereof) that is in the non-accessed state. In one optional embodiment, such power saving operation may involve a power down operation (e.g. entry into an active power down mode, entry into a precharge power down mode, etc.). As an option, such power saving operation may be initiated utilizing (e.g. in response to, etc.) a power management signal including, but not limited to a clock enable (CKE) signal, chip select (CS) signal, row address strobe (RAS), column address strobe (CAS), write enable (WE), and optionally in combination with other signals and/or commands. In other embodiments, use of a non-power management signal (e.g. control signal(s), address signal(s), data signal(s), command(s), etc.) is similarly contemplated for initiating the power saving operation. Of course, however, it should be noted that anything that results in modification of the power behavior may be employed in the context of the present embodiment.

Since precharge power down mode may provide greater power savings than active power down mode, the system may, in yet another embodiment, be operable to map the physical memory circuits to appear as at least one virtual memory circuit with at least one aspect that is different from that of the physical memory circuits, resulting in a first behavior of the virtual memory circuits that is different from a second behavior of the physical memory circuits. As an option, the interface circuit may be operable to aid or participate in the mapping of the physical memory circuits such that they appear as at least one virtual memory circuit.

During use, and in accordance with one optional embodiment, the physical memory circuits may be mapped to appear as at least one virtual memory circuit with at least one aspect that is different from that of the physical memory circuits, resulting in a first behavior of the at least one virtual memory circuits that is different from a second behavior of one or more of the physical memory circuits. Such behavior may, in one embodiment, include power behavior (e.g. a power consumption, current consumption, current waveform, any other aspect of power management or behavior, etc.). Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.).

In one exemplary embodiment, the at least one aspect that is altered by the simulation may be the precharge-to-active ratio of the physical memory circuits. In various embodiments, the alteration of such a ratio may be fixed (e.g. constant, etc.) or may be variable (e.g. dynamic, etc.).

In one embodiment, a fixed alteration of this ratio may be accomplished by a simulation that results in physical memory circuits appearing to have fewer portions (e.g. banks, etc.) that may be capable of performing operations in parallel. Purely as an example, a physical 1 Gb DDR2 SDRAM circuit with eight physical banks may be mapped to a virtual 1 Gb DDR2 SDRAM circuit with two virtual banks, by coalescing or combining four physical banks into one virtual bank. Such a simulation may increase the precharge-to-active ratio of the virtual memory circuit since the virtual memory circuit now has fewer portions (e.g. banks, etc.) that may be in use (e.g. in an active state, etc.) at any given time. Thus, there is higher likelihood that a power saving operation targeted at such a virtual memory circuit may result in that particular virtual memory circuit entering precharge power down mode as opposed to entering an active power down mode. Again as an example, a physical 1 Gb DDR2 SDRAM circuit with eight physical banks may have a probability, g, that all eight physical banks are in the precharge state at any given time. However, when the same physical 1 Gb DDR2 SDRAM circuit is mapped to a virtual 1 Gb DDR2 SDRAM circuit with two virtual banks, the virtual DDR2 SDRAM circuit may have a probability, h, that both the virtual banks are in the precharge state at any given time. Under normal operating conditions of the system, h may be greater than g. Thus, a power saving operation directed at the aforementioned virtual 1 Gb DDR2 SDRAM circuit may have a higher likelihood of placing the DDR2 SDRAM circuit in a precharge power down mode as compared to a similar power saving operation directed at the aforementioned physical 1 Gb DDR2 SDRAM circuit.

A virtual memory circuit with fewer portions (e.g. banks, etc.) than a physical memory circuit with equivalent capacity may not be compatible with certain industry standards (e.g. JEDEC standards). For example, the JEDEC Standard No. JESD 21-C for DDR2 SDRAM specifies a 1 Gb DRAM circuit with eight banks. Thus, a 1 Gb virtual DRAM circuit with two virtual banks may not be compliant with the JEDEC standard. So, in another embodiment, a plurality of physical memory circuits, each having a first number of physical portions (e.g. banks, etc.), may be mapped to at least one virtual memory circuit such that the at least one virtual memory circuit complies with an industry standard, and such that each physical memory circuit that is part of the at least one virtual memory circuit has a second number of portions (e.g. banks, etc.) that may be capable of performing operations in parallel, wherein the second number of portions is different from the first number of portions. As an example, four physical 1 Gb DDR2 SDRAM circuits (each with eight physical banks) may be mapped to a single virtual 4 Gb DDR2 SDRAM circuit with eight virtual banks, wherein the eight physical banks in each physical 1 Gb DDR2 SDRAM circuit have been coalesced or combined into two virtual banks. As another example, four physical 1 Gb DDR2 SDRAM circuits (each with eight physical banks) may be mapped to two virtual 2 Gb DDR2 SDRAM circuits, each with eight virtual banks, wherein the eight physical banks in each physical 1 Gb DDR2 SDRAM circuit have been coalesced or combined into four virtual banks. Strictly as an option, the interface circuit may be operable to aid the system in the mapping of the physical memory circuits.

Figure 7:
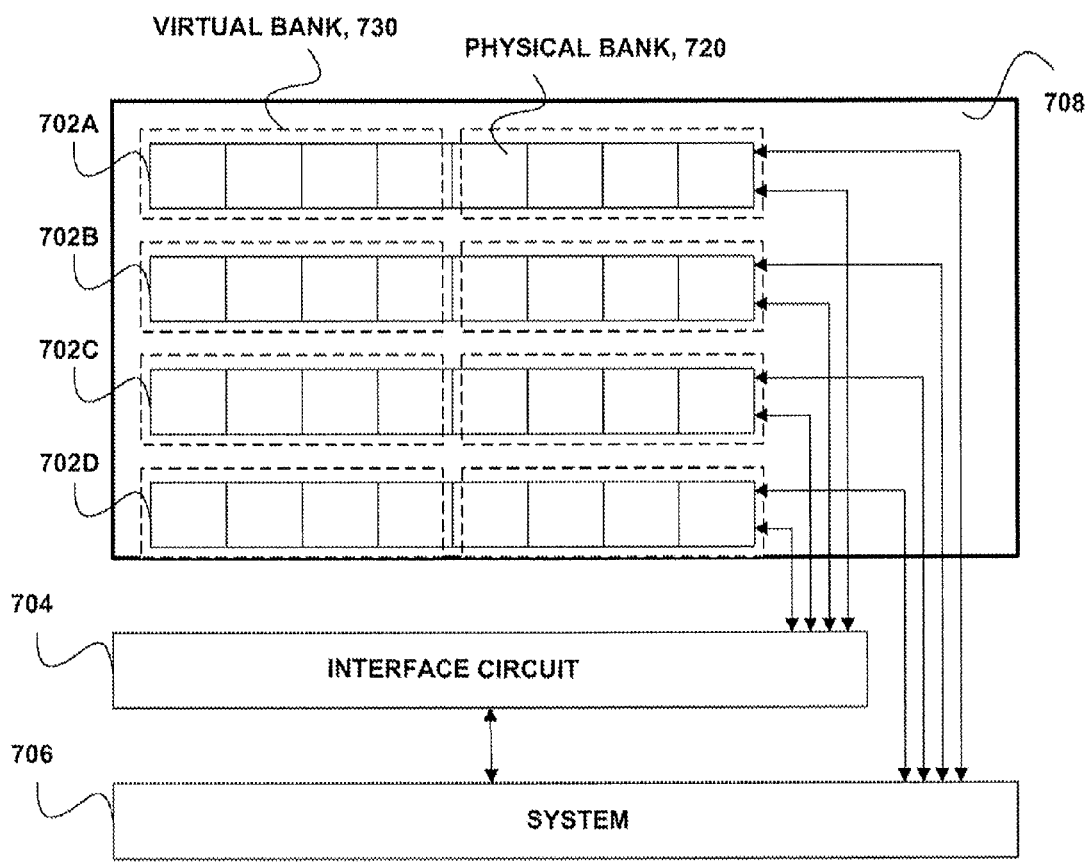
FIG. 7 shows an exemplary embodiment of a plurality of physical memory circuits that are mapped by a system, and optionally an interface circuit, to appear as a virtual memory circuit with one aspect that is different from that of the physical memory circuits.

FIG. 7 shows an example of four physical 1 Gb DDR2 SDRAM circuits 702A-D that are mapped by the system 706, and optionally with the aid or participation of interface circuit 704, to appear as a virtual 4 Gb DDR2 SDRAM circuit 708. Each physical DRAM circuit 702A-D containing eight physical banks 720 has been mapped to two virtual banks 730 of the virtual 4 Gb DDR2 SDRAM circuit 708.

In this example, the simulation or mapping results in the memory circuits having fewer portions (e.g. banks etc.) that may be capable of performing operations in parallel. For example, this simulation may be done by mapping (e.g. coalescing or combining) a first number of physical portion(s) (e.g. banks, etc.) into a second number of virtual portion(s). If the second number is less than the first number, a memory circuit may have fewer portions that may be in use at any given time. Thus, there may be a higher likelihood that a power saving operation targeted at such a memory circuit may result in that particular memory circuit consuming less power.

In another embodiment, a variable change in the precharge-to-active ratio may be accomplished by a simulation that results in the at least one virtual memory circuit having at least one latency that is different from that of the physical memory circuits. As an example, a physical 1 Gb DDR2 SDRAM circuit with eight banks may be mapped by the system, and optionally the interface circuit, to appear as a virtual 1 Gb DDR2 SDRAM circuit with eight virtual banks having at least one latency that is different from that of the physical DRAM circuits. The latency may include one or more timing parameters such as tFAW, tRRD, tRP, tRCD, tRFC(MIN), etc.

In the context of various embodiments, tFAW is the 4-Bank activate period; tRRD is the ACTIVE bank a to ACTIVE bank b command timing parameter; tRP is the PRECHARGE command period; tRCD is the ACTIVE-to-READ or WRITE delay; and tRFC(min) is the minimum value of the REFRESH to ACTIVE or REFRESH to REFRESH command interval.

In the context of one specific exemplary embodiment, these and other DRAM timing parameters are defined in the JEDEC specifications (for example JESD 21-C for DDR2 SDRAM and updates, corrections and errata available at the JEDEC website) as well as the DRAM manufacturer datasheets (for example the MICRON datasheet for 1 Gb: .times.4, .times.8, .times.16 DDR2 SDRAM, example part number MT47H256M4, labeled PDF: 09005aef821ae8bf/ Source: 09005aef821aed36, 1 GbDDR2TOC.fm-Rev. K 9/06 EN, and available at the MICRON website).

To further illustrate, the virtual DRAM circuit may be simulated to have a tRP(virtual) that is greater than the tRP (physical) of the physical DRAM circuit. Such a simulation may thus increase the minimum latency between a precharge command and a subsequent activate command to a portion (e.g. bank, etc.) of the virtual DRAM circuit. As another example, the virtual DRAM circuit may be simulated to have a tRRD(virtual) that is greater than the tRRD(physical) of the physical DRAM circuit. Such a simulation may thus increase the minimum latency between successive activate commands to various portions (e.g. banks, etc.) of the virtual DRAM circuit. Such simulations may increase the precharge-to-active ratio of the memory circuit. Therefore, there is higher likelihood that a memory circuit may enter precharge power down mode rather than an active power down mode when it is the target of a power saving operation. The system may optionally change the values of one or more latencies of the at least one virtual memory circuit in response to present, past, or future commands to the memory circuits, the temperature of the memory circuits, etc. That is, the at least one aspect of the virtual memory circuit may be changed dynamically.

Some memory buses (e.g. DDR, DDR2, etc.) may allow the use of 1T or 2T address timing (also known as 1T or 2T address clocking). The MICRON technical note TN-47-01, DDR2 DESIGN GUIDE FOR TWO-DIMM SYSTEMS (available at the MICRON website) explains the meaning and use of 1T and 2T address timing as follows: "Further, the address bus can be clocked using 1T or 2T clocking. With 1T, a new command can be issued on every clock cycle 2T timing will hold the address and command bus valid for two clock cycles. This reduces the efficiency of the bus to one command per two clocks, but it doubles the amount of setup and hold time. The data bus remains the same for all of the variations in the address bus."

In an alternate embodiment, the system may change the precharge-to-active ratio of the virtual memory circuit by changing from 1T address timing to 2T address timing when sending addresses and control signals to the interface circuit and/or the memory circuits. Since 2T address timing affects the latency between successive commands to the memory circuits, the precharge-to-active ratio of a memory circuit may be changed. Strictly as an option, the system may dynamically change between 1T and 2T address timing.

In one embodiment, the system may communicate a first number of power management signals to the interface circuit to control the power behavior. The interface circuit may communicate a second number of power management signals to at least a portion of the memory circuits. In various embodiments, the second number of power management signals may be the same of different from the first number of power management signals. In still another embodiment, the second number of power management signals may be utilized to perform power management of the portion(s) of the virtual or physical memory circuits in a manner that is independent from each other and/or independent from the first number of power management signals received from the system (which may or may not also be utilized in a manner that is independent from each other). In alternate embodiments, the system may provide power management signals directly to the memory circuits. In the context of the present description, such power management signal(s) may refer to any control signal (e.g. one or more address signals; one or more data signals; a combination of one or more control signals; a sequence of one or more control signals; a signal associated with an active (or active) operation, precharge operation, write operation, read operation, a mode register write operation, a mode register read operation, a refresh operation, or other encoded or direct operation, command or control signal, etc.). The operation associated with a command may consist of the command itself and optionally, one or more necessary signals and/or behavior.

In one embodiment, the power management signals received from the system may be individual signals supplied to a DIMM. The power management signals may include, for example, CKE and CS signals. These power management signals may also be used in conjunction and/or combination with each other, and optionally, with other signals and commands that are encoded using other signals (e.g. RAS, CAS, WE, address etc.) for example. The JEDEC standards may be describe how commands directed to memory circuits are to be encoded. As the number of memory circuits on a DIMM is increased, it is beneficial to increase the number of power management signals so as to increase the flexibility of the system to manage portion(s) of the memory circuits on a DIMM. In order to increase the number of power management signals from the system without increasing space and the difficulty of the motherboard routing, the power management signals may take several forms. In some of these forms, the power management signals may be encoded, located, placed, or multiplexed in various existing fields (e.g. data field, address field, etc.), signals (e.g. CKE signal, CD signal, etc.), and/or busses.

For example a signal may be a single wire; that is a single electrical point-to-point connection. In this case, the signal is un-encoded and not bussed, multiplexed, or encoded. As another example, a command directed to a memory circuit may be encoded, for example, in an address signal, by setting a predefined number of bits in a predefined location (or field) on the address bus to a specific combination that uniquely identifies that command. In this case the command is said to be encoded on the address bus and located or placed in a certain position, location, or field. In another example, multiple bits of information may be placed on multiple wires that form a bus. In yet another example, a signal that requires the transfer of two or more bits of information may be time-multiplexed onto a single wire. For example, the time-multiplexed sequence of 10 (a one followed by a zero) may be made equivalent to two individual signals: a one and a zero. Such examples of time-multiplexing are another form of encoding. Such various well-known methods of signaling, encoding (or lack thereof), bussing, and multiplexing, etc. may be used in isolation or combination.

Thus, in one embodiment, the power management signals from the system may occupy currently unused connection pins on a DIMM (unused pins may be specified by the JEDEC standards). In another embodiment, the power management signals may use existing CKE and CS pins on a DIMM, according to the JEDEC standard, along with additional CKE and CD pins to enable, for example, power management of DIMM capacities that may not yet be currently defined by the JEDEC standards.

In another embodiment the power management signals from the system may be encoded in the CKE and CS signals. Thus, for example, the CKE signal may be a bus, and the power management signals may be encoded on that bus. In one example, a 3-bit wide bus comprising three signals on three separate wires: CKE[0], CKE[1], and CKE[2], may be decoded by the interface circuit to produce eight separate CKE signals that comprise the power management signals for the memory circuits.

In yet another embodiment, the power management signals from the system may be encoded in unused portions of existing fields. Thus, for example, certain commands may have portions of the fields set to X (also known as don't care). In this case, the setting of such bit(s) to either a one or to a zero does not affect the command. The effectively unused bit position in this field may thus be used to carry a power management signal. The power management signal may thus be encoded and located or placed in a field in a bus, for example.

Further, the power management schemes described for the DRAM circuits may also be extended to the interface circuits. For example, the system may have or may infer information that a signal, bus, or other connection will not be used for a period of time. During this period of time, the system may perform power management on the interface circuit or part(s) thereof. Such power management may, for example, use an intelligent signaling mechanism (e.g. encoded signals, sideband signals, etc.) between the system and interface circuits (e.g. register chips, buffer chips, AMB chips, etc.), and/or between interface circuits. These signals may be used to power manage (e.g. power off circuits, turn off or reduce bias currents, switch off or gate clocks, reduce voltage or current, etc) part(s) of the interface circuits (e.g. input receiver circuits, internal logic circuits, clock generation circuits, output driver circuits, termination circuits, etc.)

It should thus be clear that the power management schemes described here are by way of specific examples for a particular technology, but that the methods and techniques are very general and may be applied to any memory circuit technology and any system (e.g. memory controller, etc.) to achieve control over power behavior including, for example, the realization of power consumption savings and management of current consumption behavior.

Figure 8:
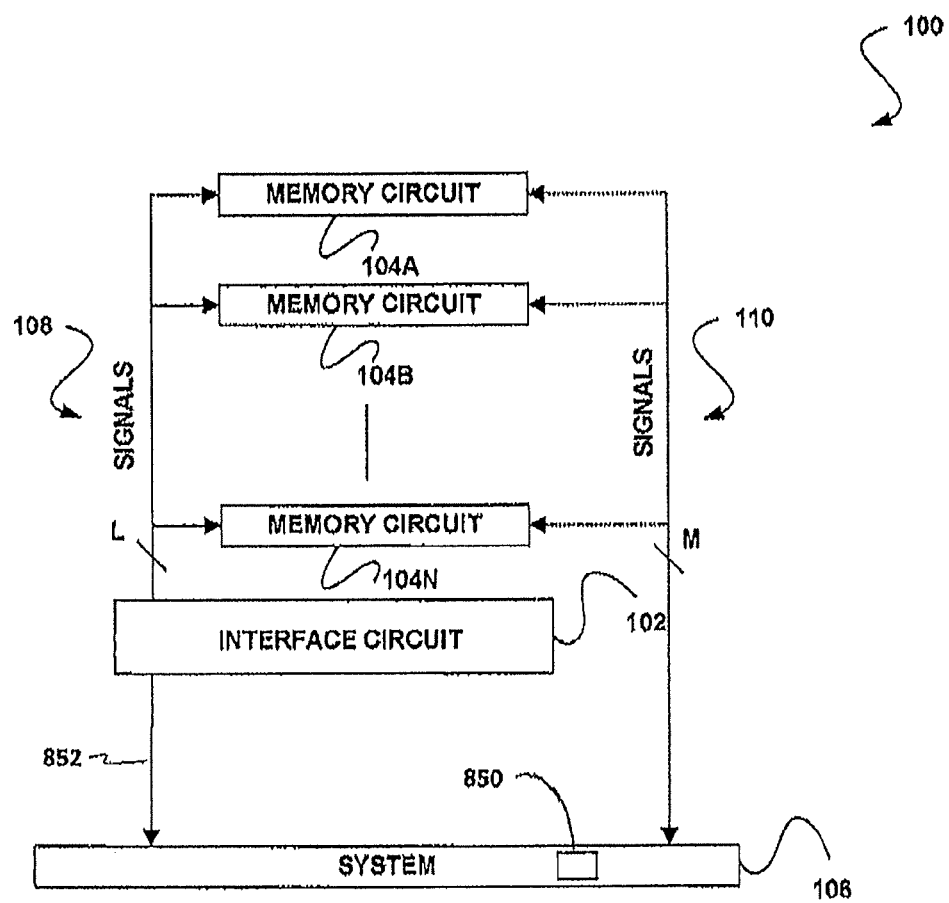
FIG. 8 illustrates an embodiment of a multiple memory circuit framework.

FIG. 8 illustrates an embodiment of a multiple memory circuit framework that is similar to the multiple memory framework in FIG. 1. FIG. 8, however, shows a memory controller 850 within the system 106. The interface circuit 102 is configured to communicate with the memory controller 850 via bus 852.

Figure 9:
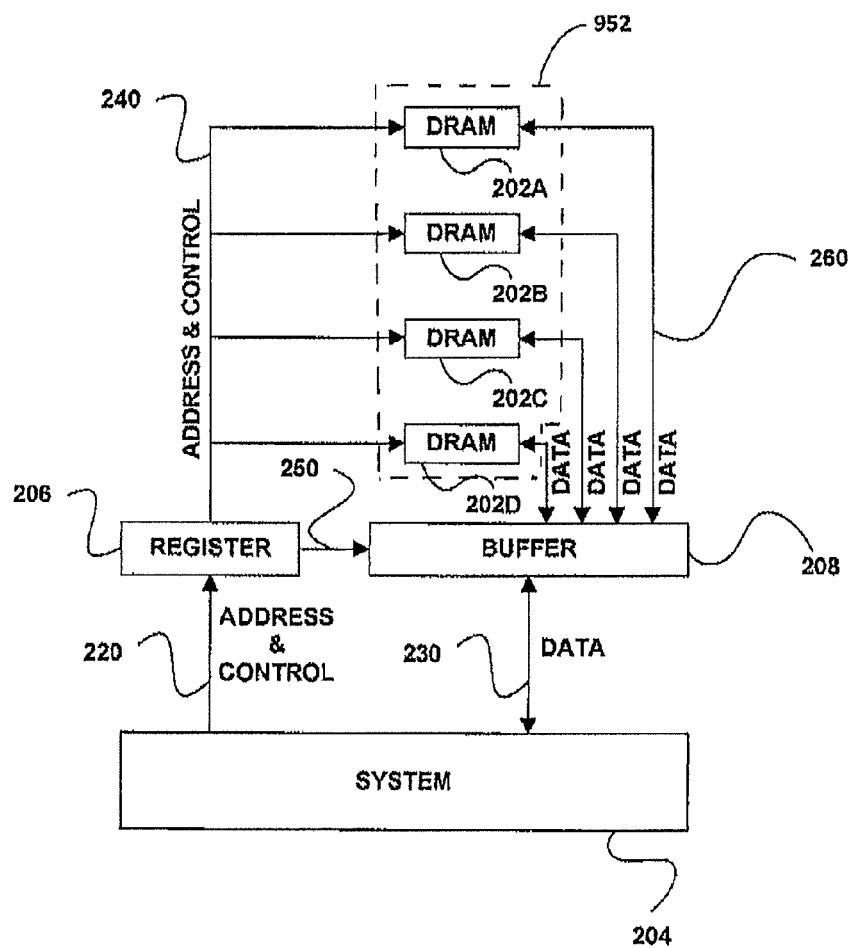
FIG. 9 shows an exemplary embodiment of an interface circuit that is operable to interface memory circuits and a system.

FIG. 9 shows an exemplary embodiment of an interface circuit that is operable to interface memory circuits 202A-D and a system 204 similar to the exemplary embodiment in FIG. 2. In FIG. 9, however, the plurality of memory circuits 202A-D is a plurality of dynamic random access memory (DRAM) circuits in a dual in-line memory module (DIMM) 952.

Figure 10:
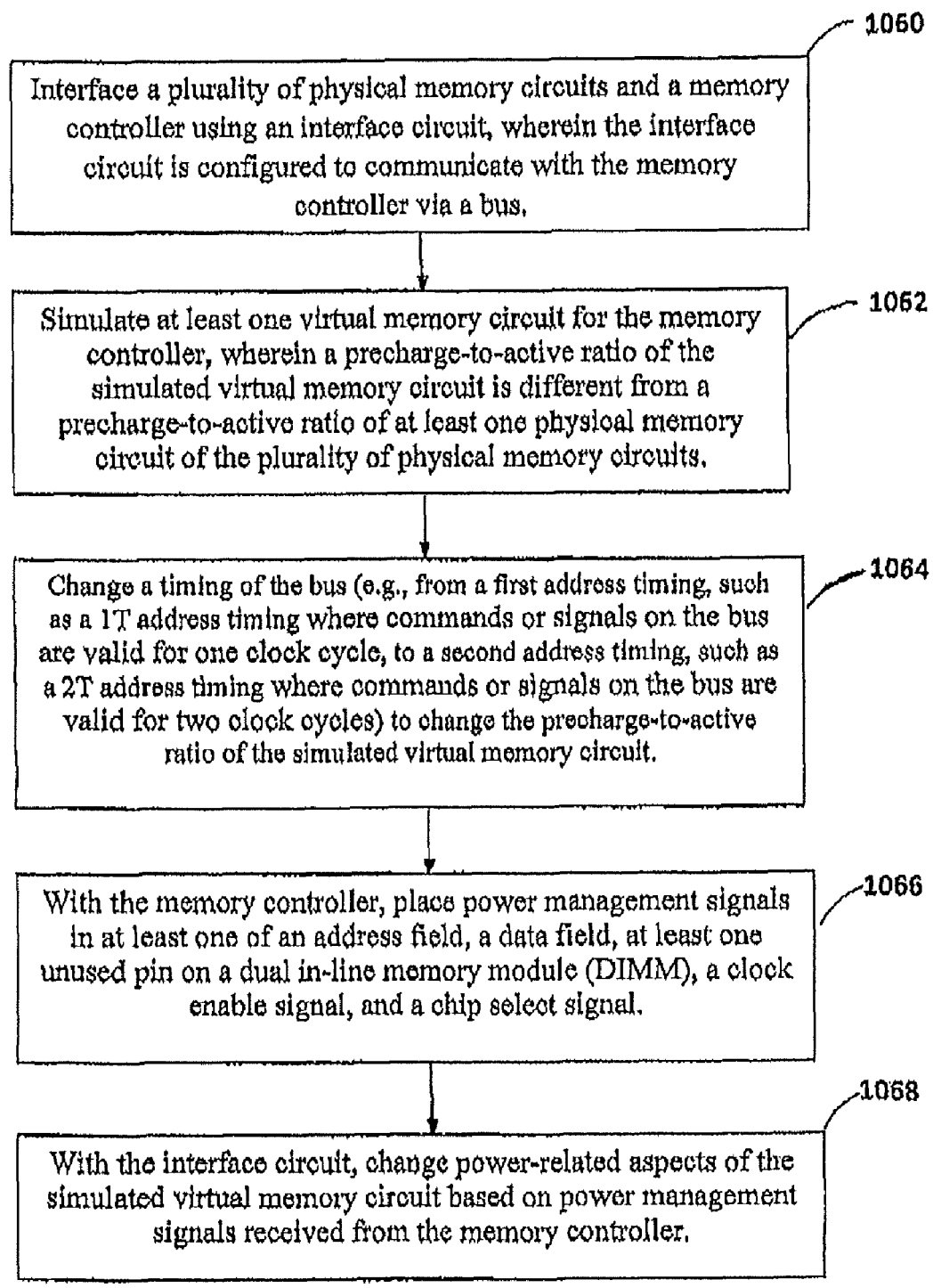
FIG. 10 is a flowchart showing an embodiment of a method for simulating at least one virtual memory circuit.

FIG. 10 is a flowchart showing an embodiment of a method for simulating at least one virtual memory circuit.

The method includes interfacing (at 1060) a plurality of physical memory circuits and a memory controller using an interface circuit, wherein the interface circuit is configured to communicate with the memory controller via a bus.

The method also includes simulating (at 1062) at least one virtual memory circuit for the memory controller, wherein a precharge-to-active ratio of the simulated virtual memory circuit is different from a precharge-to-active ratio of at least one physical memory circuit of the plurality of physical memory circuits.

The method also includes changing (at 1064) in a timing of the bus to change the precharge-to-active ratio of the simulated virtual memory circuit. In some implementations, the change in the timing of the bus is a change from a first address timing to a second address timing. The first address timing can be a 1T address timing and the second address timing is a 2T address timing. Typically, commands or signals on the bus are valid for one clock cycle when the 1T address timing is used, whereas commands or signals on the bus are valid for two clock cycles when the 2T address timing is used.

The method also includes placing (at 1066), with the memory controller, power management signals in at least one of an address field, a data field, at least one unused pin on a dual in-line memory module (DIMM), a clock enable signal, and a chip select signal.

The method also includes changing (at 1068), with the interface circuit, power-related aspects of the simulated virtual memory circuit based on power management signals received from the memory controller.

The sequence of steps in FIG. 10 should not be interpreted as limiting in any way.

While various embodiments have been described above, it should be understood that they have been presented by way of example only, and not limitation. For example, any of the elements may employ any of the desired functionality set forth hereinabove. Hence, as an option, a plurality of memory circuits may be mapped using simulation to appear as at least one virtual memory circuit, wherein a first number of portions (e.g. banks, etc.) in each physical memory circuit may be coalesced or combined into a second number of virtual portions (e.g. banks, etc.), and the at least one virtual memory circuit may have at least one latency that is different from the corresponding latency of the physical memory circuits. Of course, in various embodiments, the first and second number of portions may include any one or more portions. Thus, the breadth and scope of a preferred embodiment should not be limited by any of the above-described exemplary embodiments, but should be defined only in accordance with the following claims and their equivalents.

What is claimed is:

1. A sub-system comprising:
a plurality of physical memory circuits; and
an interface circuit configured to:
communicate between the plurality of physical memory circuits and a memory controller; and
simulate at least one virtual memory circuit for the memory controller, wherein a precharge-to-active ratio of the simulated virtual memory circuit is different from a precharge-to-active ratio of at least one physical memory circuit of the plurality of physical memory circuits, and wherein a change in a latency associated with the simulated virtual memory circuit changes the precharge-to-active ratio of the simulated virtual memory circuit.

2. The sub-system of claim 1, wherein the latency associated with the simulated virtual memory circuit is a latency between a precharge command and a subsequent activate command to activate a portion of the simulated virtual memory circuit.

3. The sub-system of claim 1, wherein the latency associated with the simulated virtual memory circuit is a latency between an activate command and a subsequent activate command to different portions of the simulated virtual memory circuit.

4. The sub-system of claim 1, wherein the latency includes a four-bank activate period (tFAW), an active-bank to active-bank command timing parameter (tRRD), a precharge command period (tRP), an active-to-read delay (tRCD), or a refresh-to-active command delay (tRFC).

5. The sub-system of claim 1, wherein the latency associated with the simulated virtual memory circuit as presented to the memory controller is greater than a latency associated with the physical memory circuits.

6. The sub-system of claim 5, wherein the change in the precharge-to-active ratio of the simulated virtual memory circuit increases the likelihood of at least one of the physical memory circuits entering a precharge mode.

7. The sub-system of claim 1, wherein the interface circuit is further configured to dynamically change the latency associated with the simulated virtual memory circuit.

8. The sub-system of claim 7, wherein the latency associated with the simulated virtual memory circuit is dynamically changed based on at least one of a past command, a present command, or an anticipated command from the memory controller to the simulated virtual memory circuit.

9. The sub-system of claim 7, wherein the latency is dynamically changed based on a temperature measurement of at least one of the physical memory circuits.

10. A method comprising:
interfacing a plurality of physical memory circuits and a memory controller using an interface circuit; and
simulating at least one virtual memory circuit for the memory controller, wherein a precharge-to-active ratio of the simulated virtual memory circuit is different from a precharge-to-active ratio of at least one physical memory circuit of the plurality of physical memory circuits, and wherein a change in a timing of a latency associated with the simulated virtual memory circuit changes the precharge-to-active ratio of the simulated virtual memory circuit.

11. The method of claim 10, wherein the latency associated with the simulated virtual memory circuit is a latency between a precharge command and a subsequent activate command to activate a portion of the simulated virtual memory circuit.

12. The method of claim 10, wherein the latency associated with the simulated virtual memory circuit is a latency between an activate command and a subsequent activate command to different portions of the simulated virtual memory circuit.

13. The method of claim 10, wherein the interface circuit is further configured to dynamically change the latency associated with the simulated virtual memory circuit.

14. The method of claim 13, wherein the latency associated with the simulated virtual memory circuit is dynamically changed based on at least one of a past command, a present command, or an anticipated command from the memory controller to the simulated virtual memory circuit.

15. The method of claim 13, wherein the latency is dynamically changed based on a temperature measurement of at least one of the physical memory circuits.

16. A system comprising:
a memory controller; and
a memory module comprising:
a plurality of physical memory circuits; and
an interface circuit configured to:
communicate between the plurality of physical memory circuits and a memory controller; and
simulate at least one virtual memory circuit for the memory controller, wherein a precharge-to-active ratio of the simulated virtual memory circuit is different from a precharge-to-active ratio of at least one physical memory circuit of the plurality of physical memory circuits, and wherein a change in a latency associated with the simulated virtual memory circuit changes the precharge-to-active ratio of the simulated virtual memory circuit.

17. The system of claim 16, wherein the latency associated with the simulated virtual memory circuit is a latency between a precharge command and a subsequent activate command to activate a portion of the simulated virtual memory circuit.

18. The system of claim 16, wherein the latency associated with the simulated virtual memory circuit is a latency between an activate command and a subsequent activate command to different portions of the simulated virtual memory circuit.

19. The system of claim 16, wherein the interface circuit is further configured to dynamically change the latency associated with the simulated virtual memory circuit.

20. The system of claim 19, wherein the latency associated with the simulated virtual memory circuit is dynamically changed based on at least one of a past command, a present command, or an anticipated command from the memory controller to the simulated virtual memory circuit.

* * * * *